United States Patent
Correa et al.

(10) Patent No.: US 6,796,804 B2
(45) Date of Patent: Sep. 28, 2004

(54) CIRCUIT CARD PACKAGE INCLUDING A PARENT CARD AND CAPABLE OF ACCOMMODATING AT LEAST ONE CHILD CARD

(75) Inventors: Everardo Correa, Elizabeth, NJ (US); Joseph L. Gangemi, Manalapan, NJ (US); Tom Woods, Monmouth Beach, NJ (US); Ernesto Huerta, Howell, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/021,971

(22) Filed: Dec. 13, 2001

(65) Prior Publication Data

US 2003/0114021 A1 Jun. 19, 2003

(51) Int. Cl.[7] .............................. H01R 12/00; H05K 1/00
(52) U.S. Cl. ................................... 439/65; 439/61
(58) Field of Search .......................... 439/61, 65, 377; 361/788, 683, 721, 730, 796; 379/325

(56) References Cited

U.S. PATENT DOCUMENTS

| 963,431 | A | * | 7/1910 | Gates | 249/38 |
| 3,755,630 | A | * | 8/1973 | Boyer | 379/325 |
| 5,926,378 | A | * | 7/1999 | DeWitt et al. | 361/788 |
| 6,181,565 | B1 | * | 1/2001 | Schmitt et al. | 361/756 |
| 6,222,725 | B1 | * | 4/2001 | Jo | 361/683 |
| 6,261,104 | B1 | * | 7/2001 | Leman | 439/61 |

* cited by examiner

Primary Examiner—Chandrika Prasad

(57) ABSTRACT

An improved circuit card package wherein additional child cards are accommodated by providing an interface adaptor board having connectors for receiving the child cards. The interface adaptor board is itself received by a connector on a parent card, which plugs into a system backplane.

6 Claims, 1 Drawing Sheet

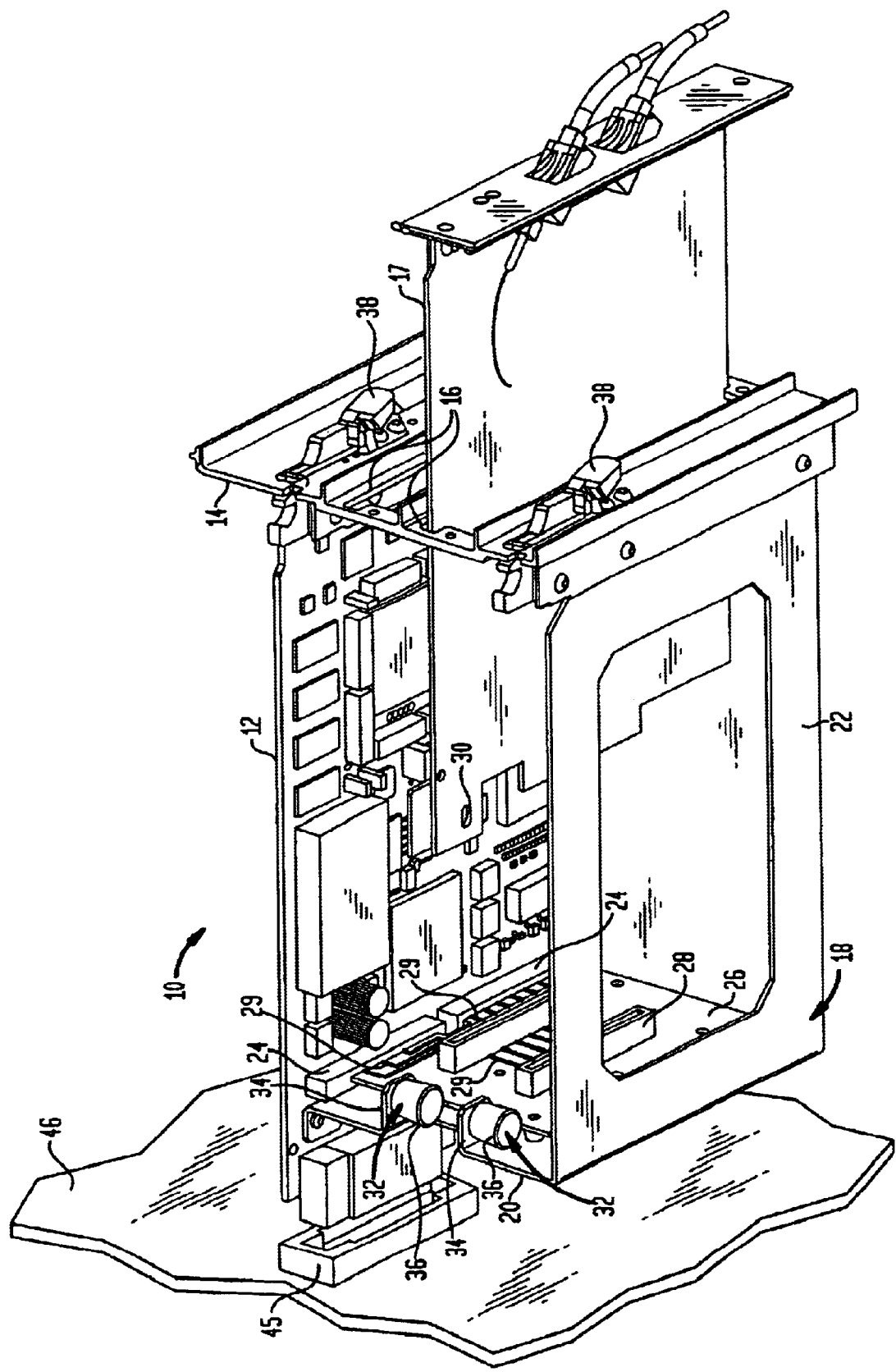

CIRCUIT CARD PACKAGE INCLUDING A PARENT CARD AND CAPABLE OF ACCOMMODATING AT LEAST ONE CHILD CARD

BACKGROUND OF THE INVENTION

This invention relates to a circuit card package and, more particularly, to a circuit card package wherein child cards are mounted parallel to a parent card without requiring the use of screws, nuts, standoffs, etc., so that field replacements and upgrades are easily effected.

In the field of telecommunications equipment, there are increasing requirements to pack more circuitry into a limited space. In the past, when telecommunications systems were expanded by increasing the number of child cards, it was typical to have to redesign the backplane to add additional connectors to accommodate the additional child cards. Redesigning the backplane is a major undertaking, both in time and expense. It would therefore be desirable to provide a circuit card package which can accommodate additional child cards without requiring a new design of the backplane.

SUMMARY OF THE INVENTION

According to the present invention, there is provided a circuit card package which includes a first circuit card (i.e., parent card) with a first connector mounted thereon. An interface adaptor board is secured to the first connector and is oriented in a plane orthogonal to the first circuit card. At least one second connector is mounted to the interface adaptor board and is adapted to have secured thereto a respective one of at least one second circuit card (i.e., child card) oriented parallel to the first circuit card.

BRIEF DESCRIPTION OF THE DRAWING

The foregoing will be more readily apparent upon reading the following description in conjunction with the drawing in which the single FIGURE thereof is a perspective view of a circuit card package constructed according to the present invention.

DETAILED DESCRIPTION

Referring now to the drawing, shown therein is a circuit card package, designated generally by the reference numeral 10, constructed in accordance with the principles of this invention. The package 10 includes a circuit card 12 which is adapted for insertion into a card edge connector 45 on a backplane 46. The circuit card 12 is commonly referred to as a parent card. A substantially planar faceplate bracket 14 is secured orthogonally to the circuit card 12. The faceplate bracket 14 is formed with, illustratively, two openings 16 each for receiving therethrough a respective second type of circuit card 17 in parallel to the circuit card 12. The circuit card 17 is commonly referred to as a child card.

A second bracket member 18 is formed from planar sheet material and is bent at a right angle. The bracket member 18 is secured to both the circuit card 12 and the faceplate bracket 14 so as to have a first portion 20 orthogonal to the circuit card 12 and parallel to the faceplate bracket 14, and a second portion 22 orthogonal to the faceplate bracket 14 and parallel to the circuit card 12. A card edge connector 24 is mounted on the circuit card 12. An interface adaptor board 26 is received by the connector 24 and is secured to the first portion 20 of the second bracket member 18, so as to be parallel to the first portion 20.

The interface adapter board 26 has mounted thereon a pair of card edge connectors 28, each in alignment with a respective one of the openings 16 in the faceplate bracket 14 so that a circuit card 17 inserted through an opening 16 can have its leading edge received by the respective connector 28. The interface adaptor board 26 is formed with wiring traces 29 interconnecting the terminals of each connector 28 with corresponding terminals of each connector 24.

There are situations where the circuit card 17 should not be removed or inserted while the telecommunications equipment is operational. Such insertion is commonly referred to as "hot insertion". For such a situation, to retain the circuit card 17 within the package 10, the circuit card 17 is formed with an opening 30 near its leading edge. To cooperate with the opening 30, there is provided a latch mechanism 32 mounted to the first portion 20 of the second bracket member 18. A respective latch mechanism 32 is provided for each of the circuit cards 17 which may be installed in the package 10 and illustratively comprises a spring-loaded plunger of the type manufactured by Southco, Inc., of Concordville, PA, and identified by Part No. 56-99-196-20. Each latch mechanism 32 is secured to a respective bent tab 34 formed from the first portion 20 of the second bracket member 18. The spring-loaded plunger 32 has a spring biased pin secured to the knob 36, so that when the circuit card 17 is inserted into the package 10, the knob 36 is pulled away from the bent tab 34 against the force of the internal spring, allowing the leading edge of the circuit card 17 to pass the pin. When the circuit card 17 is fully seated in the connector 28, the knob 36 is released and the pin extends into the opening 30 of the circuit card 17, thereby retaining the circuit card 17 within the package 10. The package 10 can then be installed in a rack of telecommunications equipment and secured thereto by the latches 38 on the faceplate bracket 14, as is well known in the art. Since the latch mechanism 32 is only accessible when the package 10 is out of the rack of telecommunications equipment, the circuit card 17 is not hot insertable. In situations where the circuit card 17 is allowed to be hot insertable, the latch mechanism 32 can be eliminated.

Accordingly, there has been disclosed an improved circuit card package which allows additional child cards to be installed without requiring any redesign of the backplane. While an illustrative embodiment of the present invention has been disclosed herein, it is understood that various adaptations and modifications to the disclosed embodiment are possible, and it is intended that this invention be limited only by the scope of the appended claims.

What is claimed is:

1. An apparatus, comprising:
   a) a backplane having a backplane connector mounted thereon; and
   b) a circuit card package, said circuit card package comprising:
      i) a first circuit card inserted into said backplane connector on a said backplane and having a first card edge connector mounted thereon;
      ii) an interface adaptor board inserted into said first card edge connector and oriented in a plane orthogonal to said first circuit card; and
      iii) at least one second card edge connector mounted to said interface adaptor board and adapted to have secured thereto a respective one of at least one second circuit card oriented parallel to said first circuit card;
      iv) wherein said interface adaptor board is formed with wiring traces interconnecting terminals of each of said at least one second card edge connector with corresponding terminals of said first card edge connector.

2. The apparatus of claim 1 further comprising:

a substantially planar faceplate bracket secured orthogonally to said first circuit card, said faceplate bracket being formed with at least one opening each for receiving a respective one of said at least one second circuit card therethrough in a direction parallel to said first circuit card; and a second bracket member secured to said first circuit card and to said faceplate bracket, said second bracket member being formed from planar sheet material and being bent at a right angle so as to have a first portion orthogonal to said first circuit card and a second portion orthogonal to said faceplate bracket;

wherein said interface adaptor board is secured to said first portion of said second bracket member.

3. The apparatus of claim 2 further comprising:

at least one latch mechanism secured to said first portion of said second bracket member and each cooperating with structure on a respective one of said at least one second circuit card to selectively retain said respective second circuit card in engagement with a respective one of said at least one second connector.

4. The apparatus of claim 3 wherein each of said at least one second circuit card is formed with a respective opening therethrough and each of said at least one latch mechanism includes a spring biased pin adapted to extend through said respective card opening to prevent movement of said respective second circuit card.

5. The apparatus of claim 1, wherein said first circuit card has a leading edge, wherein said leading edge extends beyond the connection of said interface adapter board and said first card edge connector, and wherein said first circuit card is inserted into said backplane connector.

6. A circuit card package, comprising:

a first circuit card having a leading edge insertable into a connector on a backplane and having a first card edge connector mounted thereon;

an interface adaptor board secured to said first card edge connector and oriented in a plane orthogonal to said first circuit card, wherein said leading edge of said first circuit card extends beyond the connection of said interface adapter board and said first card edge connector; and at least one second card edge connector mounted to said interface adaptor board and adapted to have secured thereto a respective one of at least one second circuit card oriented parallel to said first circuit card;

wherein said interface adaptor board is formed with wiring traces interconnecting terminals of each of said at least one second card edge connector with corresponding terminals of said first card edge connector.

* * * * *